(12) United States Patent
Lee

(10) Patent No.: US 9,711,398 B2
(45) Date of Patent: *Jul. 18, 2017

(54) GLOBAL DIELECTRIC AND BARRIER LAYER

(71) Applicant: Taiwan Semiconductor Manufacturing Company, Ltd., Hsin-Chu (TW)

(72) Inventor: Ya-Lien Lee, Baoshan Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/961,657

(22) Filed: Dec. 7, 2015

(65) Prior Publication Data

US 2016/0086846 A1 Mar. 24, 2016

Related U.S. Application Data

(63) Continuation of application No. 14/063,175, filed on Oct. 25, 2013, now Pat. No. 9,209,072.

(51) Int. Cl.
| | |
|---|---|
| H01L 29/267 | (2006.01) |
| H01L 21/324 | (2006.01) |
| H01L 29/786 | (2006.01) |
| H01L 21/768 | (2006.01) |
| H01L 23/532 | (2006.01) |
| H01L 21/02 | (2006.01) |

(52) U.S. Cl.
CPC .... H01L 21/76843 (2013.01); H01L 21/0223 (2013.01); H01L 21/76802 (2013.01); H01L 21/76829 (2013.01); H01L 21/76832 (2013.01); H01L 21/76834 (2013.01); H01L 21/76849 (2013.01); H01L 21/76855 (2013.01); H01L 21/76877 (2013.01); H01L 23/53295 (2013.01); *H01L 2924/0002* (2013.01)

(58) Field of Classification Search
None
See application file for complete search history.

(56) References Cited

U.S. PATENT DOCUMENTS

| 9,209,072 B2 * | 12/2015 | Lee ................... H01L 21/76843 |
| 2006/0216932 A1 | 9/2006 | Kumar et al. |
| 2010/0081271 A1 * | 4/2010 | Ishizaka ............ H01L 21/76831 438/622 |
| 2010/0227479 A1 | 9/2010 | Kim et al. |

(Continued)

FOREIGN PATENT DOCUMENTS

CN 102867911 A * 1/2013

*Primary Examiner* — Calvin Choi
*Assistant Examiner* — Xiaoming Liu
(74) *Attorney, Agent, or Firm* — Haynes and Boone, LLP

(57) ABSTRACT

Methods of fabricating a semiconductor device are described. The method includes forming a patterned oxide layer having a plurality of openings over a substrate, depositing a metal layer in the openings to form metal plugs, depositing a global transformable (GT) layer on the oxide layer and the metal plugs, and depositing a capping layer directly on the GT layer without exposing the GT layer to ambient air. The GT layer on the oxide layer transforms into a dielectric oxide and the GT layer on the metal plugs remains conductive during deposition of the capping layer.

20 Claims, 8 Drawing Sheets

(56) References Cited

U.S. PATENT DOCUMENTS

| | | | |
|---|---|---|---|
| 2010/0327456 A1* | 12/2010 | Chen | H01L 21/7682 257/773 |
| 2011/0100450 A1* | 5/2011 | Lee | H01L 31/02167 136/256 |
| 2012/0177841 A1 | 7/2012 | Thompson | |
| 2012/0231618 A1* | 9/2012 | Masuda | H01L 29/66068 438/522 |

* cited by examiner

GLOBAL DIELECTRIC AND BARRIER LAYER

CROSS-REFERENCE TO RELATED APPLICATIONS

This application is a continuation of U.S. Ser. No. 14/063,175, filed Oct. 25, 2013 by inventor Ya-Lien Lee, entitled "Global Dielectric And Barrier Layer", which is herein incorporated by reference in its entirety.

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Present methods of manufacturing use silicon carbide as an etch stop layer and as a copper barrier layer, but silicon carbide has low etch selectivity and can be easily etched away. Moreover, copper often diffuses into the tungsten used in metal plugs, which has undesired effects on yield and reliability. Thus, it is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
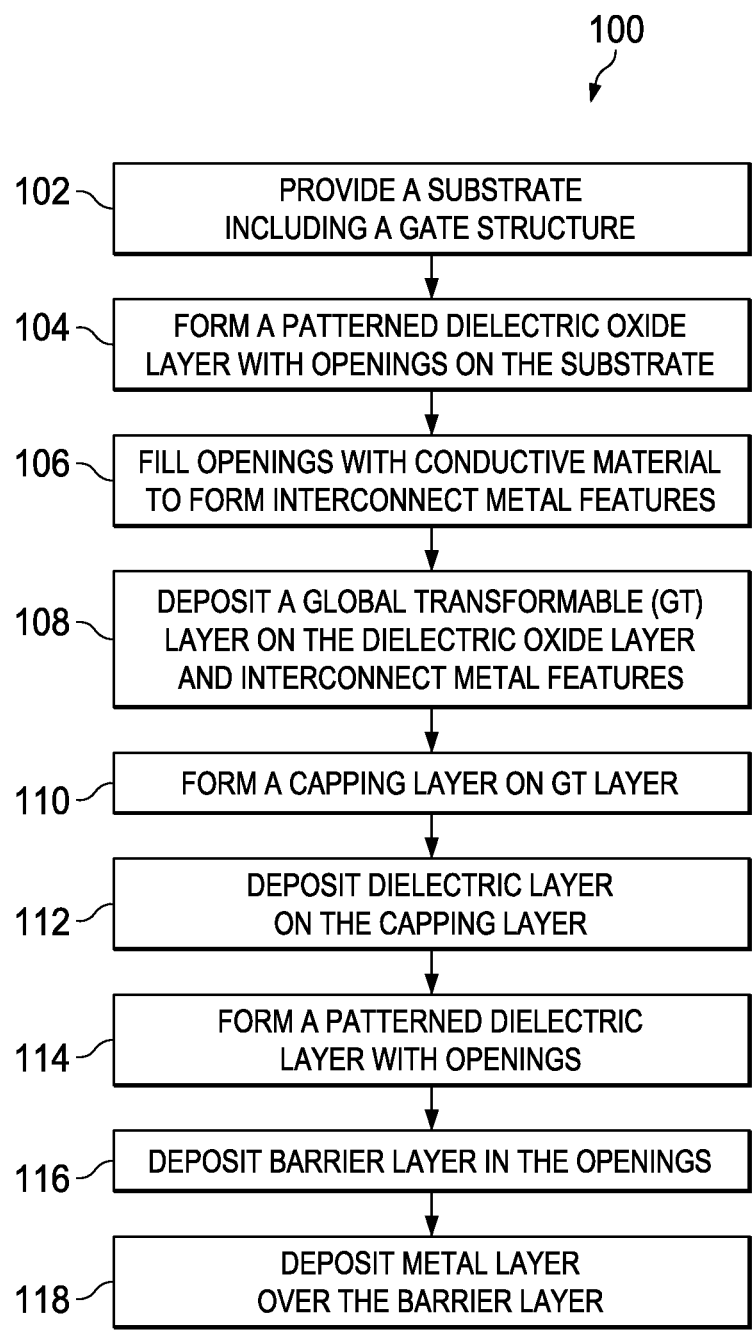
FIG. 1 is a flowchart of an example method for fabricating a semiconductor device constructed according to various aspects of the present disclosure.

FIG. 1 is a flowchart of one embodiment of a method 100 of fabricating one or more semiconductor devices according to aspects of the present disclosure. The method 100 is discussed in detail below, with reference to a semiconductor device 200 shown in FIGS. 2 to 9 for the sake of example.

Figure 2:
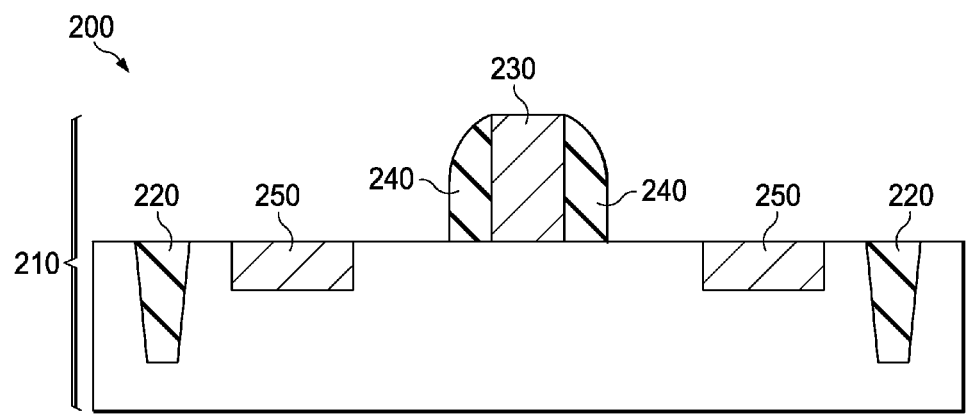
FIGS. 2 to 9 are cross-sectional views of an example semiconductor device at fabrication stages constructed according to the method of FIG. 1.

Referring FIGS. 1 and 2, the method 100 begins at step 102 by providing a semiconductor substrate 210. The semiconductor substrate 210 includes silicon. In alternative embodiments, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The semiconductor substrate 210 also includes one or more gate structures or stacks 230. The gate stacks 230 may include a gate dielectric layer and metal gate (MG). The gate dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. The stacks 230 are formed by any suitable processes such as deposition, patterning and etch.

The semiconductor substrate 210 also includes sidewall spacers 240 formed on the sidewalls of the gate stacks 230. The sidewall spacers 240 may include a dielectric material such as silicon oxide. Alternatively, the sidewall spacers 240 may include silicon nitride, silicon carbide, silicon oxynitride, or combinations thereof. The sidewall spacers 240 may be formed by deposition and dry etching processes known in the art.

The semiconductor substrate 210 also includes conductive features 250. The conductive features 250 may be formed by a procedure including lithography, etching and deposition. In one embodiment, the conductive features 250 include capacitors, resistors or a portion of a resistor. Alternatively, the conductive features 250 may include doped regions, such as source or drain (S/D) regions separated by the gate stacks 230. The S/D regions are formed by a proper technique, such as one or more ion implantations. The S/D regions may further include lightly doped (LDD) and heavily doped regions. After the formation of the source and drain regions, one or more annealing processes may be performed. In one embodiment, S/D features may be formed in the S/D regions by one or more epitaxy or epitaxial (epi) processes.

Figure 3:
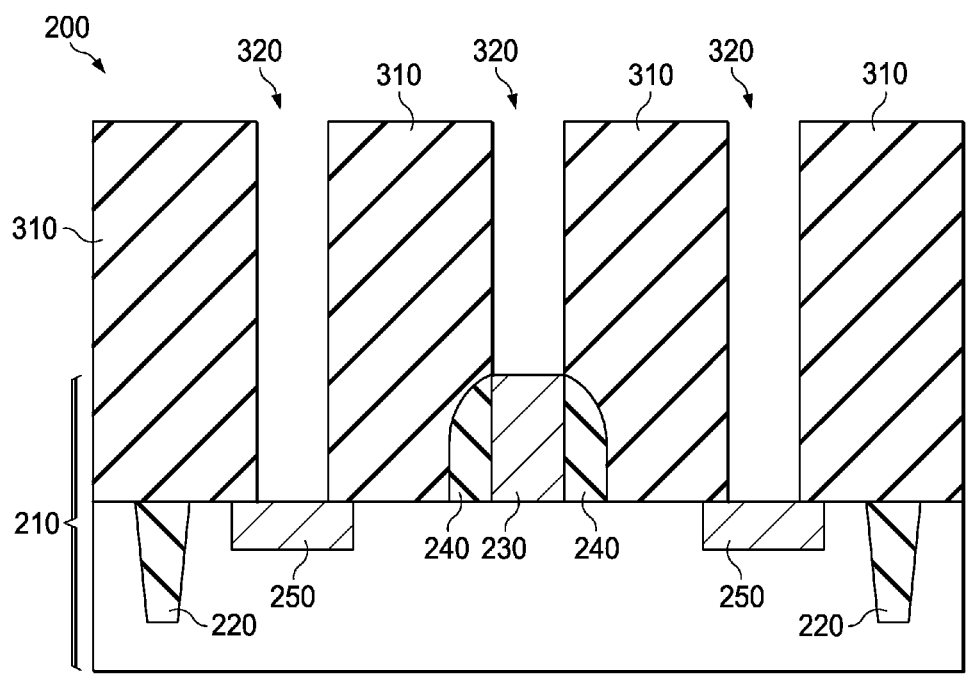

Referring now to FIGS. 1 and 3, the method 100 proceeds to step 104 by forming a patterned inter-layer dielectric (ILD) layer 310 on the substrate 210. In the present embodiment, the ILD layer 310 includes dielectric materials, such as silicon oxide, silicon nitride, a dielectric material having a dielectric constant (k) lower than thermal silicon oxide (hereafter referred to as low-k dielectric material layer), or other suitable dielectric material layer. In various examples, the low-k dielectric material may include fluorinated silica glass (FSG), carbon doped silicon oxide, amorphous fluorinated carbon, Parylene, BCB (bis-benzocyclobutenes), SiLK (Dow Chemical, Midland, Mich.), polyimide, and/or other materials as examples. In another example, the low-k dielectric material may include an extreme low k (XLK) dielectric material. A process of forming the ILD layer 310 may utilize spin-on coating or chemical vapor deposition (CVD).

The ILD layer 310 may be patterned by lithography and etching processes to form openings 320 in the ILD layer 310 such that the gate stack 230 and conductive features 250 are at least partially exposed within the openings 320. For example, a patterned photoresist layer (or patterned resist layer) is formed on the ILD layer 310. The patterned resist layer includes various openings that define portions of the ILD layer 310 for openings and expose those portions for subsequent etch. Particularly, the openings are aligned with respective gate stack 230 and the conductive features 250. In one embodiment, the patterned resist layer is formed by a procedure including coating, exposure, and developing.

Figure 4:
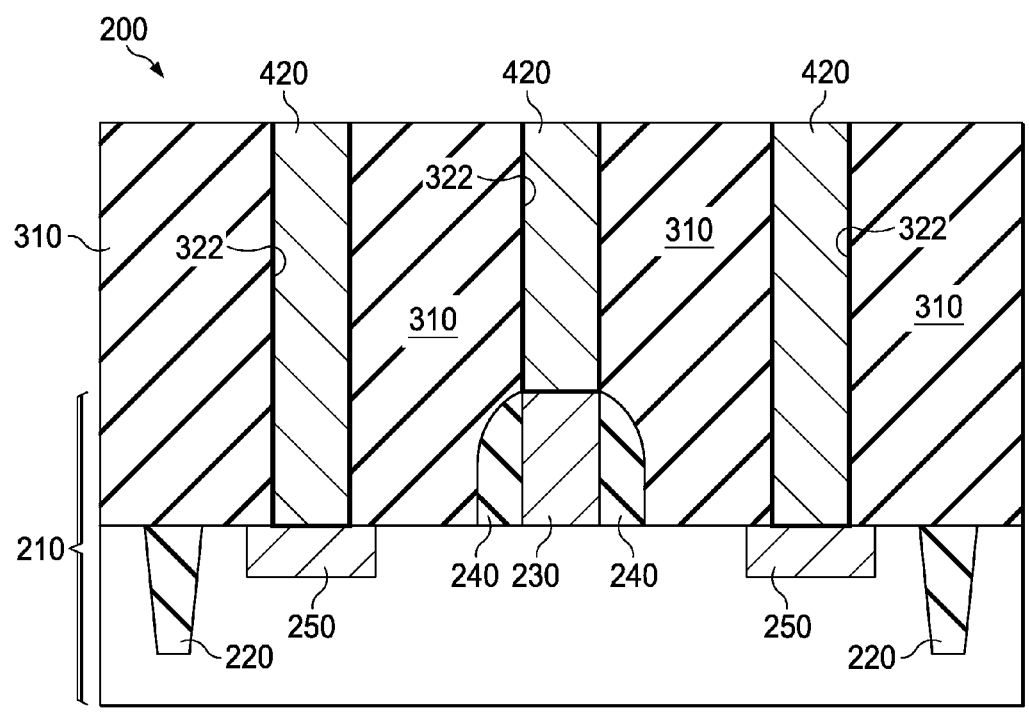

Turning now to FIG. 4 and step 106, the openings 320 are filled with conductive material such as one or more metals, resulting in metal plugs, or local inter-connection features to provide electronic connections among the gate stack 230 and the conductive feature 250 with other active regions. In one embodiment, a barrier layer 322 is deposited in the openings 320 first. The barrier layer 322 is electrically conductive but does not permit inter-diffusion and reactions between the ILD layer 310 and a metal layer to be filled in the openings 320. The barrier layer 322 may include refractory metals and their nitrides. The barrier layer 322 may include tantalum (Ta), titanium (Ti), manganese (Mn), cobalt (Co), ruthenium (Ru), titanium nitride (TiN), tantalum nitride (TaN), tungsten nitride (WN), titanium silicon nitride (TiSiN), tantalum silicon nitride (TaSiN), manganese oxide (MnO), aluminium nitride, aluminium oxide, or other suitable materials. The barrier layer 322 may be deposited by PVD, CVD, ALD, metal-organic chemical vapor deposition (MOCVD) or other suitable processes.

A metal layer is then formed on the barrier layer 322. The metal layer fills in the openings 320 and is further disposed on the ILD layer 310. The metal layer may include copper (Cu), aluminum (Al), tungsten (W) or other suitable conductive material. The metal layer may be deposited by any suitable techniques, such as PVD, CVD and MOCVD. CMP is then performed to remove excess metal layer to form various interconnect metal features 420, as well as to planarize the top surface. In an alternative embodiment when the underlying conductive features 250 are S/D features, the metal features 420 are also referred to as metal contact, contact features or contacts to provide electrical routing between metal lines and the substrate 210. In one embodiment when the underlying conductive features 250 are metal lines of a different metal layer, the metal features 420 are also referred to as metal via, via features or vias to provide vertical electrical routing between metal lines.

Figure 5:
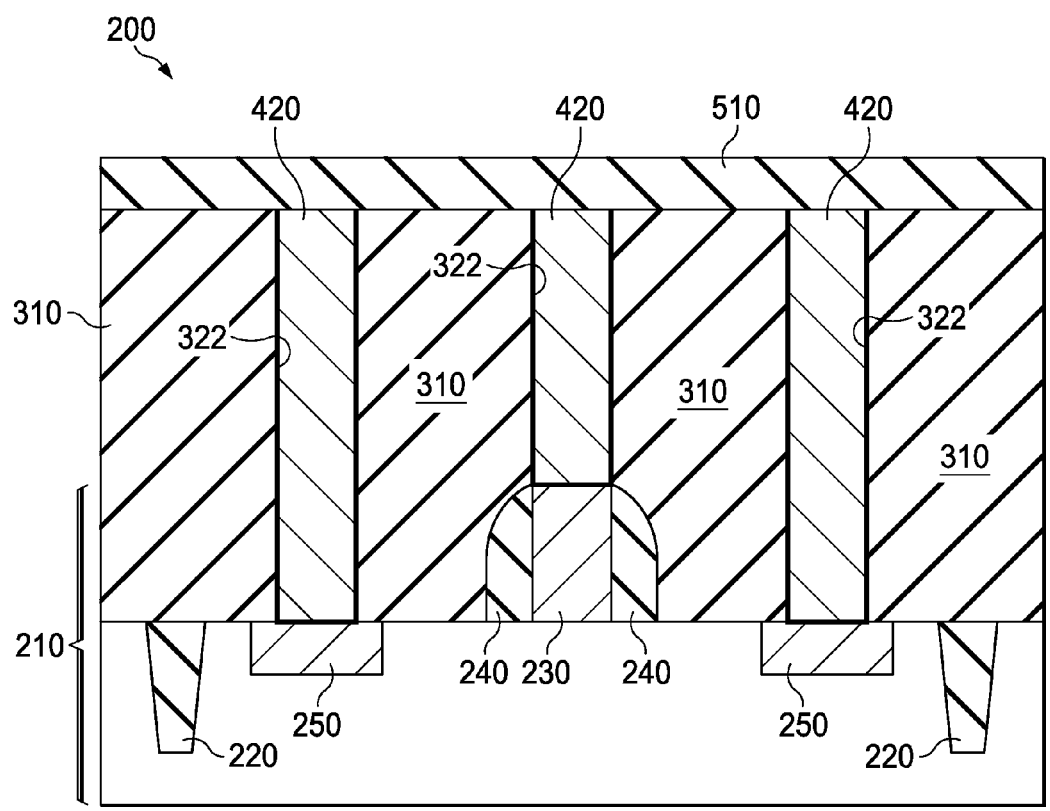

Moving on to FIG. 5 and step 108, a global transformable (GT) layer 510 is deposited on the ILD layer 310 and the interconnect metal features 420. As can be seen, the GT layer 510 is, for example, a single layer that covers the entire top portion. In other embodiments, the GT layer 510 includes multiple layers. The GT layer 510 will perform the functions of both an etch stop layer and a barrier layer, as further discussed below. In various embodiments, the GT layer 510 includes a metal nitride ($M_xN_y$). The metal may be any suitable metal, such as aluminum (Al), tantalum (Ta), manganese (Mn), ruthenium (Ru), tin (Sn), magnesium (Mg), or a combination thereof. In certain embodiments, the metal nitride includes about 60 to about 70% of the metal and about 30 to about 40% nitrogen. Exemplary metal nitrides include aluminum nitride ($Al_xN_y$), manganese nitride ($Mn_xN_y$) and tin nitride ($Sn_xN_y$), wherein x and y are integers and range from 1-3.

The GT layer 510 may be formed by any suitable process, including CVD or atomic layer deposition (ALD). In an exemplary process, a metal organic precursor is reacted with a nitrogen-containing gas, such as ammonia ($NH_3$). The metal precursor may contain Mn, Ta, Al, Ru, Sn, or Mg. For example, $Mn_xN_y$ can be formed from bis(N,N-diisopropyl-pentyl-amidinato) manganese (II) and $NH_3$ gas. In one embodiment, the process is performed at an operational pressure of about 0.5 to 5 Torr, a temperature of about 150° C. to about 450° C., a metal precursor flow of about 300 to about 1000 sccm, and a $NH_3$ flow of about 500 to about 2000 sccm.

Figure 6:
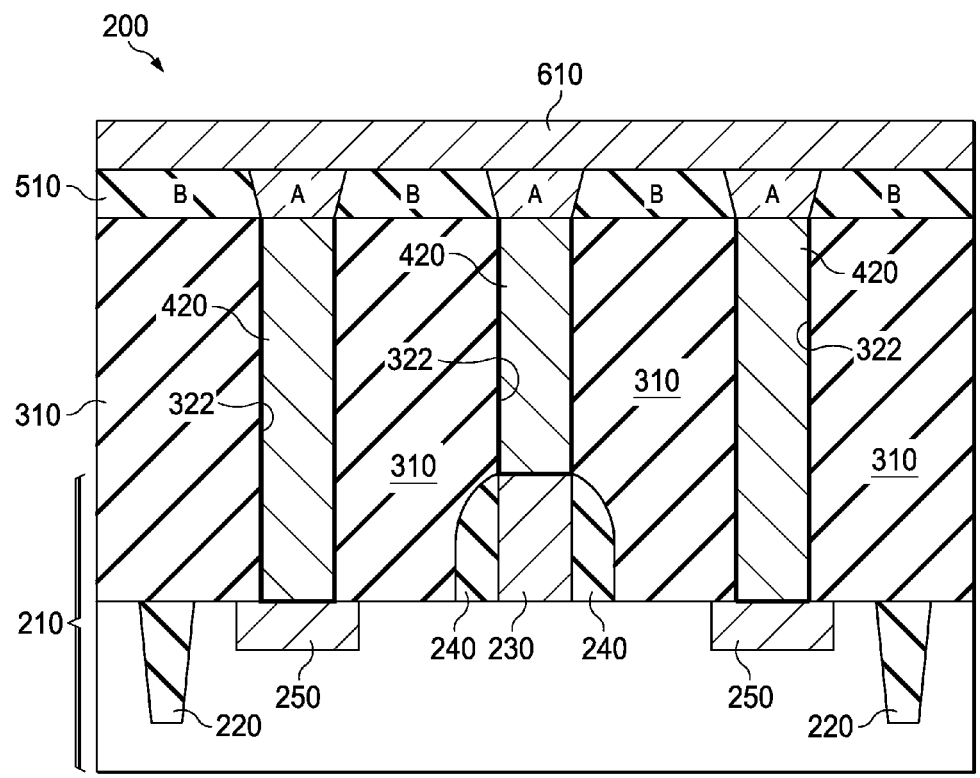

Referring now to FIG. 6 and moving on to step 110, a capping layer 610 is formed directly on the GT layer 510. In one embodiment, the capping layer 610 includes silicon carbide (SiC). The capping layer 610 may alternatively include other suitable materials such as TiN or metal carbides.

The capping layer 610 may be formed by any suitable process, including plasma enhanced CVD (PECVD). The parameters of the CVD process, such as flow rate, operating pressure, temperature, and reaction time depend on the apparatus used, or on any special process requirements. In one embodiment, to deposit a SiC layer, a flow rate of 3-methylsilane ($Si(CH_3)_3H$) of about 600 sccm, a high frequency radio frequency (HFRF) of about 150 Watts, and a temperature of about 350° C. to about 450° C. is used. $Si(CH_3)_3$, $Si(CH_3)_2H_2$, or $Si(CH_3)_3H$ can be used as the precursor gas.

In the present embodiment, the GT layer 510 is not exposed to an air environment after it is deposited and before the capping layer 610 is deposited. For example, there is no break in vacuum after deposition of the GT layer 510 and before deposition of the capping layer 610. In an exemplary embodiment, a vacuum is maintained (i.e., vacuum is not broken) between the steps of depositing the GT layer 510 and depositing the capping layer 610. The GT layer 510 should not be exposed to ambient air during capping layer deposition.

With reference to FIG. 6, during deposition of the capping layer 610, the GT layer 510 forms different compositions when deposited on different substrates. The GT layer 510 formed over the interconnect metal features 420 (denoted by sections A in FIG. 6) remain conductive. For example, if the GT layer 510 includes a metal nitride, the metal nitride is not substantially changed and remains conductive.

The GT layer 510 over the ILD layer 310 (denoted by sections B in FIG. 6), however, transforms to a dielectric material, such as a dielectric oxide. In an embodiment, the GT layer 510 includes a metal nitride, which transforms to a metal oxynitride ($M_xO_yN_z$). The metal oxynitride may include about 10 to 20% metal, about 70 to 80% oxygen, and about 5 to 15% nitrogen.

The GT layer 510 self-transforms into either a conductive barrier layer or dielectric layer based on the substrate it is deposited on. In this way, the GT layer 510 is self-aligned over different substrates. That is, the conductive barrier portion of the GT layer 510 is aligned over the metal features 420, and the dielectric material portion of the GT layer 510 is aligned over the ILD layer 310.

Without being bound by theory, it is believed that due to the generally higher temperatures that take place during the capping layer deposition, oxygen in the ILD layer 310 diffuses into the metal nitride of the GT layer 510 to form a metal oxynitride. Thus, the B sections of the GT layer 510 are dielectric layers, while the A sections of the GT layer 510 are metal barrier layers.

The metal nitride in the GT layer 510 should be protected from premature oxidation because of the selective oxidation of the GT layer 510. Certain sections of the GT layer 510 (A sections) should not be oxidized, while other sections of the GT layer 510 (B sections) should become oxidized.

To prevent premature oxidation of the metal nitride, the metal nitride and capping layer material should, for example, be in the same tool. In one embodiment, the tool includes a CVD tool, a PVD tool, or other suitable tools. Using a single tool prevents exposure of the GT layer 510 to ambient air in the atmosphere and oxidation.

In an exemplary embodiment, the GT layer 510 and the capping layer 610 are formed in-situ. In other words, the GT layer 510 and the capping layer 610 are formed in a same vacuum platform without being exposed to the atmosphere. For example, the GT layer 510 and the capping layer 610 may be formed utilizing a PVD tool. In some embodiments, the PVD tool may include two chambers within a vacuum platform. Accordingly, a substrate may be transported from one chamber to the other chamber without being exposed to the outside environment. One chamber may be operable to form the GT layer 510 and the other chamber may be operable to form the capping layer 610. In other embodiments, the PVD tool may include a single chamber that is operable to form both the GT layer 510 and the capping layer 610.

Figure 7:
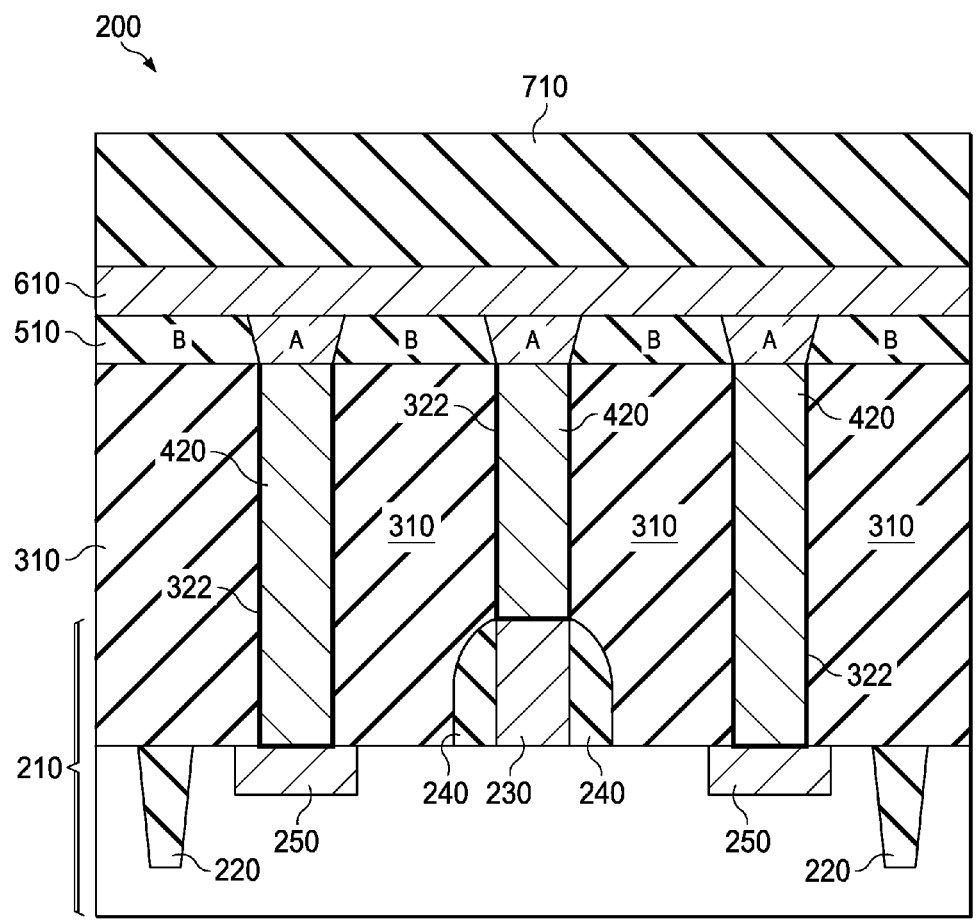

At FIG. 7 and step 112, a dielectric layer 710 is deposited on the capping layer 610 by suitable deposition techniques. The dielectric layer 710 includes dielectric materials, such as silicon oxide, silicon nitride, a low-k dielectric material layer, or other suitable dielectric material layer. In various examples, the low k dielectric material may include FSG, carbon doped silicon oxide, amorphous fluorinated carbon, Parylene, BCB, SiLK, polyimide, and/or other materials as examples. In another example, the low k dielectric material may include an XLK dielectric material. A process of forming the dielectric layer 710 may utilize spin-on coating or CVD.

Figure 8:
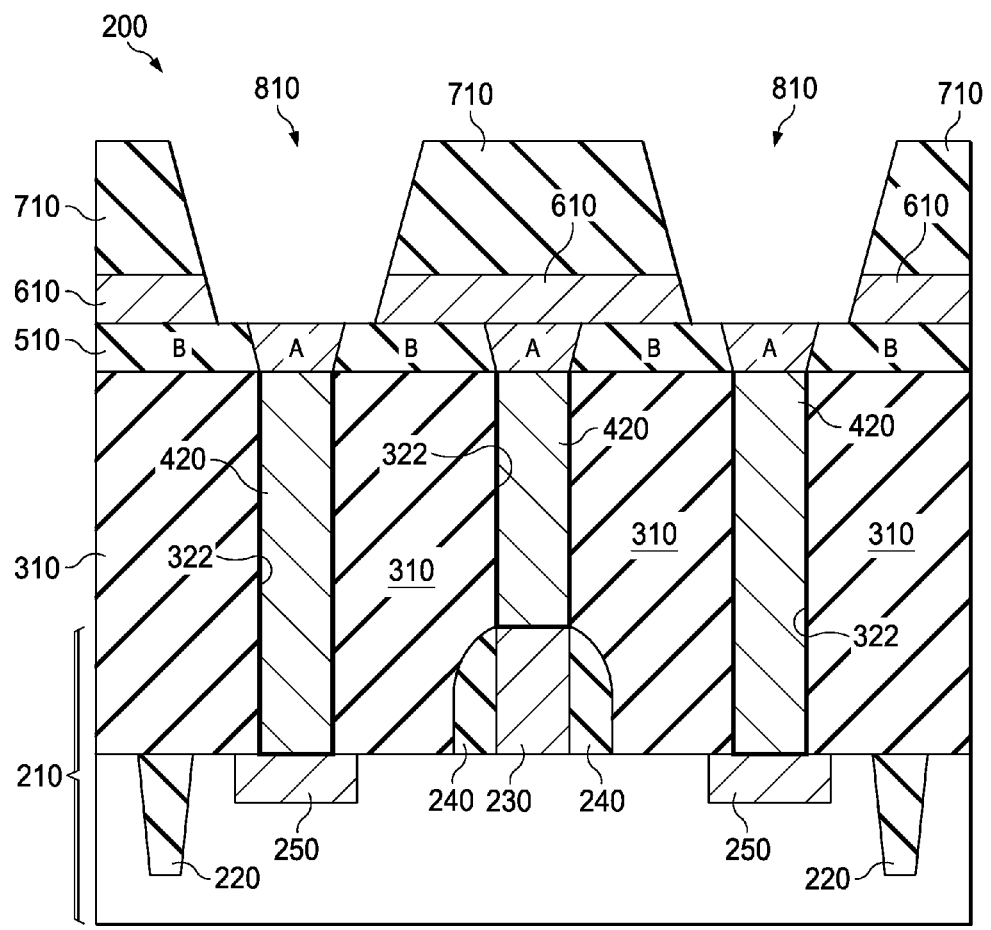

Referring now to FIG. 8 and step 114, the dielectric layer 710 is patterned by lithography and etching processes to form an opening or via 810 through the dielectric layer 710 and the capping layer 610. The GT layer 510 acts as an etch stop layer, and the material of the GT layer 510 may be selected to include a material with high etching resistance that is not intended to be etched or removed. In an exemplary embodiment, the GT layer 510 has a slower etch rate than the capping layer 610. Moreover, when the GT layer 510 is deposited as a thin film (e.g., about 10 to 20 angstroms), it does not provide high resistivity. By providing materials with different etch rates, highly selective etching may be achieved. The via 810 at least partially exposes the A sections of the GT layer 510. Due to its high etch selectivity, only a thin (e.g., about 10 to about 20 angstroms) GT layer is needed. The thin GT layer also allows for a back-end-of-line (BEOL) that has a lower capacitance. Moreover, because the GT layer also acts as a barrier layer, the thickness of a PVD barrier layer in a following metallization process may be thinner than is typically necessary.

Figure 9:
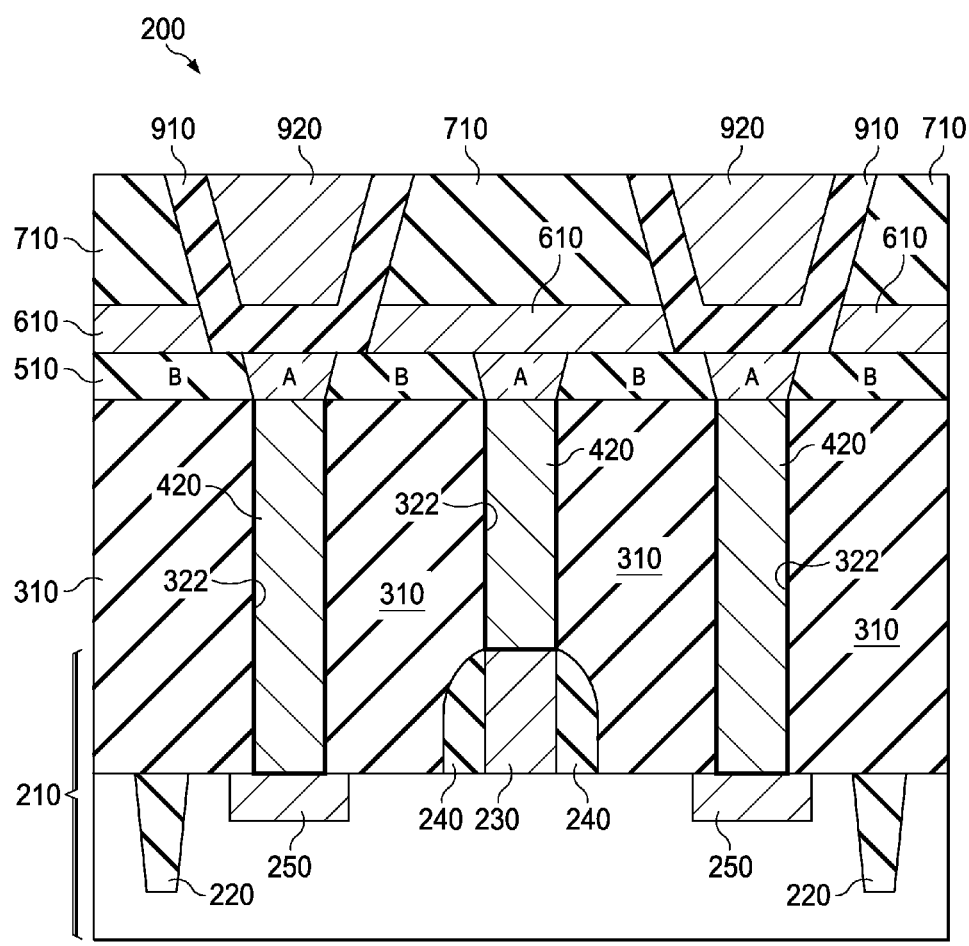

Moving on to FIG. 9, the method 100 proceeds to step 116 by depositing a barrier layer 910 in the via 810 to prevent diffusion. The barrier layer 910 is electrically conductive but does not permit inter-diffusion and reactions between the dielectric layer 710 and a metal layer to be filled in the via 810 later. The barrier layer 910 may include refractory metals and their nitrides. In various examples, the barrier layer 910 includes Ta, TaN, TiN, Co, WN, TiSiN, and TaSiN, or combinations thereof. The barrier layer 910 may include multiple films, and may be formed by a procedure including lithography, etching and deposition.

At step 118 of method 100, a metal layer 920 is deposited on the barrier layer 910. The metal layer 920 is disposed on barrier layer 910 and the dielectric layer 710. The metal layer 920 may Cu, Al, W, or other suitable conductive material. For example, the metal layer 920 may copper or a copper alloy such as copper manganese (CuMn), copper aluminum (CuAl), copper titanium, (CuTi), copper vanadium (CuV), copper chromium (CuCr), copper silicon (CuSi) or copper niobium (CuNb). In one embodiment, the metal layer 920 is a copper layer.

The method for patterning the metal layer 920 includes a lithography process and etching. In the lithography process, a patterned resist layer is formed on the metal layer as an etch mask having various openings that exposes the regions of the metal layer to be removed. A metal etch process is then applied to the metal layer through the openings of the etch mask. CMP is then performed on the metal layer 920 and dielectric layer 710 to planarize the top surface.

Additional steps can be provided before, during, and after the method 100, and some of the steps described can be replaced, eliminated, or moved around for additional embodiments of the method 100.

Based on the above, the present disclosure offers methods for fabricating a semiconductor device. The method employs a GT layer that includes a dielectric and conductive barrier materials. The GT layer, in one embodiment, is formed as a single layer in a simple process, and transforms during the manufacturing process, based on the substrate on which it is formed. The GT layer performs as both an etch stop layer with high etch selectivity and an effective barrier layer to prevent diffusion.

The present disclosure provides many different embodiments of fabricating a semiconductor device that provide one or more improvements over other existing approaches. In one embodiment, a method for fabricating a semiconductor device includes forming a patterned oxide layer having a plurality of openings over a substrate. The method also includes depositing a metal layer in the openings to form metal plugs, depositing a global transformable (GT) layer on the oxide layer and the metal plugs, and depositing a capping layer directly on the GT layer without exposing the GT layer to ambient air. The GT layer on the oxide layer transforms into a dielectric oxide and the GT layer on the metal plugs remains conductive during deposition of the capping layer.

In another embodiment, a method for fabricating a semiconductor device includes forming a patterned oxide layer having a plurality of openings over a substrate, depositing a metal layer in the openings to form metal plugs, depositing a global transformable (GT) layer on the oxide layer and the metal plugs, wherein the GT layer comprises a metal nitride, and depositing a capping layer directly on the GT layer, without exposing the GT layer to ambient air. The metal nitride on the oxide layer transforms to a metal oxynitride and the metal nitride on the metal plugs remains conductive during deposition of the capping layer.

In yet another embodiment, a method for fabricating a semiconductor device forming a patterned oxide layer having a plurality of openings over a substrate. The method also includes depositing a tungsten layer in the openings to form tungsten plugs, depositing a global transformable (GT) layer on the oxide layer and the tungsten plugs at a first temperature, wherein the GT layer is transformed by heat, depositing a silicon carbide layer directly on the GT layer at a second temperature that is higher than the first temperature, without exposing the GT layer to ambient air, depositing a barrier layer on the GT layer on the tungsten plugs, and depositing a metal layer on the barrier layer. The GT layer on the oxide layer transforms into a dielectric oxide and the GT layer on the tungsten plugs remains conductive during deposition of the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   receiving a substrate that includes a dielectric layer and a conductive feature disposed within the dielectric layer;
   using at least one of chemical vapor deposition and atomic layer deposition, depositing a global transformable (GT) layer of a metal nitride composition having a uniform conductivity directly on the dielectric layer and the conductive feature; and
   performing a transition process the GT layer such that a first portion of the GT layer disposed over the dielectric layer has a higher resistivity than a second portion of the GT layer disposed over the conductive feature.

2. The method of claim 1, wherein the GT layer has a uniform composition throughout the first portion and the second portion prior to the performing of the transition process.

3. The method of claim 1, wherein the transition process is configured to cause a chemical reaction between the dielectric layer and the first portion of the GT layer such that the first portion has the higher resistivity.

4. The method of claim 3, wherein the chemical reaction includes an oxidation of the first portion of the GT layer.

5. The method of claim 1, wherein the performing of the transition process includes the transition process occurring during a depositing of a capping layer directly on the deposited GT layer, wherein after the transition process the capping layer interfaces the first portion of the GT layer and the second portion of the GT layer.

6. The method of claim 1, wherein the first portion of the GT layer includes a metal oxynitride after the performing of the transition process, and wherein the second portion of the GT layer includes the metal nitride after the performing of the transition process.

7. The method of claim 6, wherein the metal oxynitride comprises between about 10% and about 20% metal, between about 70% and about 80% oxygen, and between about 5% to about 15% nitrogen.

8. The method of claim 6, wherein the metal nitride comprises between about 60% to about 70% metal and between about 30% to 40% nitrogen.

9. The method of claim 1, wherein the conductive feature is a first conductive feature, the method further comprising:
   depositing another dielectric layer over the GT layer;
   etching an opening in the another dielectric layer, wherein the first portion of the GT layer is used as an etch stop for the etching the opening; and
   forming a second conductive feature in the opening and on the first portion of the GT layer and the second portion of the GT layer, wherein the first conductive feature and the second conductive feature are electrically coupled by the second portion of the GT layer.

10. The method of claim 1, wherein the metal nitride of the GT layer includes at least one metal selected from the group consisting of: aluminum (Al), tantalum (Ta), manganese (Mn), ruthenium (Ru), tin (Sn), and magnesium (Mg).

11. A method comprising:
   receiving a semiconductor substrate having an interconnect feature and an inter-layer dielectric;
   forming a material layer having a uniform composition over the interconnect feature and the inter-layer dielectric; and
   in-situ with the forming the material layer, depositing using a chemical vapor deposition process, a capping layer on the material layer, wherein during the chemical vapor deposition process of the capping layer the material layer and the inter-layer dielectric to react such that a first portion of the material layer disposed directly over the inter-layer dielectric has a higher resistivity than a second portion of the material layer disposed directly over the interconnect feature.

12. The method of claim 11, wherein the depositing of the capping layer is further configured to cause the first portion of the material layer to oxidize.

13. The method of claim 11, wherein the material layer is deposited as a metal nitride and after the depositing of the capping layer, the first portion of the material layer includes a metal oxynitride and the second portion of the material layer includes the metal nitride.

14. The method of claim 11, wherein the capping layer is one of silicon carbide, titanium nitride, and metal carbide.

15. The method of claim 11, wherein the chemical vapor deposition process is a plasma-enhanced chemical vapor deposition process.

16. The method of claim 11 further comprising:
etching a recess in the capping layer exposing the first portion of the material layer and the second portion of the material layer, wherein the etching includes using the second portion of the material layer as an etch stop; and
forming another interconnect feature in the recess and on the first portion and the second portion.

17. A method comprising:
receiving a substrate having a first conductive feature and a first inter-layer dielectric material;
forming a globally transformable (GT) layer having a uniform composition upon the first conductive feature and the first inter-layer dielectric material;
depositing a capping layer on the GT layer, wherein the depositing of the capping layer is configured to cause a first portion of the GT layer disposed directly over the inter-layer dielectric material to have a higher resistivity than a second portion of the GT layer disposed directly over the first conductive feature;
depositing a second inter-layer dielectric material on the capping layer;
etching an opening in the second inter-layer dielectric material, wherein the etching the opening includes etching through the capping layer and using the first portion of the GT layer as an etch stop; and
forming a second conductive feature in the opening and on the second portion of the GT layer, wherein the second conductive feature is electrically coupled to the first conductive feature by the second portion of the GT layer.

18. The method of claim 17, wherein the GT layer as deposited is a metal nitride, the first portion of the GT layer includes a metal oxynitride after the depositing of the capping layer, and wherein the second portion of the GT layer includes the metal nitride after the depositing of the capping layer.

19. The method of claim 17, wherein the depositing of the capping layer is further configured to cause the first portion of the GT layer to react with the inter-layer dielectric material.

20. The method of claim 17, wherein the depositing of the capping layer is further configured to cause an oxidation of the first portion of the GT layer.

* * * * *